United States Patent
Shimada et al.

(10) Patent No.: US 7,164,207 B2
(45) Date of Patent: Jan. 16, 2007

(54) WIRING STRUCTURE FOR SEMICONDUCTOR DEVICE

(75) Inventors: Masahiro Shimada, Kyoto-fu (JP);
Miki Moriyama, Kyoto-fu (JP);
Masanori Murakami, Kyoto-fu (JP);
Naoki Shibata, Aichi-ken (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 59 days.

(21) Appl. No.: 10/747,807

(22) Filed: Dec. 30, 2003

(65) Prior Publication Data

US 2004/0183201 A1 Sep. 23, 2004

(30) Foreign Application Priority Data

Jan. 17, 2003 (JP) .............................. 2003-010044

(51) Int. Cl.
*H01L 29/40* (2006.01)
(52) U.S. Cl. ................. 257/767; 257/761; 257/764
(58) Field of Classification Search ............... 257/762, 257/767, 764, 761; 438/687, 648, 656, 683, 438/685
See application file for complete search history.

(56) References Cited

U.S. PATENT DOCUMENTS 6,322,120 B1 * 11/2001 Carey ...................... 294/110.2
6,323,120 B1 * 11/2001 Fujikawa et al. ........... 438/629
6,753,251 B1 * 6/2004 Ritzdorf et al. ............. 438/638

OTHER PUBLICATIONS

Kazuhide Abe, et al., "High Reliable Cu Damascene Interconnects with Cu/Ti/TiN/Ti Layered Structure", Oki Technical Review, No. 184, vol. 67, No. 3, pp. 65-68. Oct. 2000.
Miki Moriyama, et al., "Future Fabrication Techniques for Cu Wires used in Si ULSI Devices", Material Japan, vol. 39, No. 11, pp. 901-908 (2000).

* cited by examiner

*Primary Examiner*—Roy Karl Potter
(74) *Attorney, Agent, or Firm*—McGinn IP Law Group, PLLC

(57) ABSTRACT

A wiring structure for semiconductor device has a wiring layer that includes copper as main component and a crystal grain promotion layer that promotes enlargement in a crystal grain of the wiring layer.

14 Claims, 5 Drawing Sheets

INVENTION

AFTER 4 HOURS

AFTER 18 HOURS

AFTER 61 HOURS

INVENTION

AFTER 4 HOURS

AFTER 18 HOURS

AFTER 61 HOURS

COMPARATIVE EXAMPLE

AFTER 3 HOURS

AFTER 25 HOURS

AFTER 173 HOURS

INVENTION

AFTER 4 HOURS

AFTER 18 HOURS

AFTER 61 HOURS

COMPARATIVE EXAMPLE

AFTER 3 HOURS

AFTER 25 HOURS

AFTER 173 HOURS

SURFACE

CROSS SECTION

SURFACE

CROSS SECTION

WIRING STRUCTURE FOR SEMICONDUCTOR DEVICE

The present application is based on Japanese patent application No.2003-010044, the entire contents of which are incorporated herein by reference.

BACKGROUND OF THE INVENTION

1. Field of the Invention

This invention relates to a wiring structure of semiconductor device and particularly to a wiring structure suitable for VLSI and ULSI.

2. Description of the Related Art

The speeding-up of silicon (Si) semiconductor is performed by reducing the device size to increase the integration density of transistors formed on the single-crystal Si substrate based on the Moore's Law. At present, the production of 0.13 μm rule device has started. In 2005, it is planned to use ultra fine wiring with a width of less than 0.10 μm. A reduction in wiring width and wiring interval causes an increase in electrical resistance of wiring and in inter-wiring capacity and, therefore, the wiring signal propagation speed decreases according as the ultra fine process makes progress. It is recognized especially after the 0.13 μm rule that the problem of wiring delay adversely affects the operation speed of device. In the future development of Si semiconductor, the conversion of wiring material to new one is indispensable for increasing the wiring signal propagation speed since it is difficult to increase it by using the conventional ultra fine process.

The wiring delay can be reduced by using a wiring material with a resistivity lower than Al that is conventionally used as wiring material. In 1997, IBM Corp., USA developed copper (Cu) wiring. The resistivity of bulk Cu is 1.7 μΩ·cm while the resistivity of bulk Al is 2.7 μΩ·cm.

However, in making Cu wiring, since the vapor pressure of Cu etching product is low and therefore the semiconductor has to be heated to a high temperature, the process of Al wiring cannot be used that, as shown in FIG. 1A, Al thin film 2 is formed on the entire semiconductor substrate 1 and then a wiring region is covered with resist 3 and then the unnecessary Al uncovered is removed by etching. Therefore, another process of making Cu wiring is proposed that, as shown in FIG. 1B, a trench or viahole 11 with wiring width is formed in semiconductor 10 before forming Cu film 5 and then Cu atom is embedded therein and then unnecessary Cu part 6 is removed by polishing such as CMP (chemical mechanical polishing) (this process is called Damascene process). Further, since, in Cu wiring, it is necessary to prevent the diffusion of Cu atom to the Si semiconductor, a barrier layer 4 needs to be formed between the Si semiconductor and Cu (See e.g., Miki Moriyama et al., "Future Fabrication Techniques for Cu Wires used in Si ULSI Devices", Materia Japan, Vol.39, No.11, pp.901–908 (2000), and Kazuhide Abe et al., "High Reliable Cu Damascene Interconnects with Cu/Ti/TiN/Ti Layered Structure", Oki-Denki-Kenkyu-Kaihatsu, No.184, Vol.67, No.3, pp.65–68, (October, 2000)). Also, since Cu needs to be completely embedded into the trench or viahole, the thickness of Cu film must be reduced according as the wiring width decreases.

However, in forming the barrier layer by Damascene process, it is difficult to uniformly form the barrier layer in the trench or viahole. Furthermore, the barrier layer needs to have a thickness greater than 10 nm at thinnest portion in order to function as barrier layer for preventing the diffusion. As a result, the barrier layer must be thick to some extent and the resistivity increases due to the thickness. Still furthermore, the existence of barrier layer interferes with the reduction of wiring interval. Thus, a technique for forming Cu wiring without using the barrier layer has been researched.

On the other hand, from the viewpoint of the resistivity of Cu as wiring material, when the wiring width is reduced to 0.10 μm, that width becomes equal to mean free path of electron and, therefore, there is concern that the resistivity if Cu wiring material increases. This is because an increase in resistivity caused by electron scattering becomes significant according as the film thickness and average grain diameter decrease. Therefore, it is necessary to increase the average grain diameter in order to lower the resistivity of Cu wiring.

Furthermore, in case of Cu wiring, different from the case of Al wiring, there is concern that some crystal grains are preferentially grown when being kept at room temperature after the film formation to produce a nonuniform grain distribution and the reliability lowers due to dispersion of resistivity caused by the nonuniform grain distribution. Although the growth of large crystal grains contributes to a reduction in resistivity from the viewpoint of electrical resistance, it is necessary to control the microscopic structure of Cu wiring in consideration of both increasing and equalization of grain diameter in order to produce a nano-scale Cu wiring with low resistivity and high reliability.

The inventors have found that the growth of crystal grain depends on intrinsic strain (energy assist given to Cu film by the substrate) to be generated at the interface of Si substrate and Cu film. The invention is invented in researching the lowering of resistivity caused by increasing of crystal grain diameter, based on the growth process of Cu crystal grain in consideration of materials interposed between Si substrate and Cu film.

SUMMARY OF THE INVENTION

It is an object of the invention to provide a wiring structure for semiconductor device to offer low resistivity and high reliability.

According to the invention, a wiring structure for semiconductor device, comprises:

a wiring layer that includes copper as main component; and a crystal grain promotion layer that promotes enlargement in a crystal grain of the wiring layer.

The crystal grain composing the wiring layer is enlarged by the existence of crystal grain promotion layer, and therefore a nano-scale Cu wiring with low resistivity can be realized.

In the invention, it is preferred that the wiring structure for semiconductor device has been composed as follows (1) to (5).

(1) The crystal grain of the wiring layer satisfies a relation of D>10×L where D is an average grain diameter of crystal grain to be enlarged finally in the wiring layer and L is mean free path of electron. By satisfying that relation, the enlarged crystal grain of wiring layer comes close to single crystal and the resistivity of wiring layer is thereby close to that of bulk.

(2) The crystal grain promotion layer is disposed between a semiconductor or dielectric film and the wiring layer.

(3) The crystal grain layer has a good contact with the semiconductor or dielectric film and the wiring layer and is of a material that has a low reactivity to the semiconductor or dielectric film and the wiring layer. Thereby, a wiring structure for semiconductor device to offer low resistivity and high reliability can be obtained.

(4) The crystal grain layer is of high melting point metal, or nitride or carbide of the high melting point metal.

(5) The crystal grain layer is of a material selected from the group of titanium, tantalum, titanium nitrides, titanium carbides, tantalum nitrides and tantalum carbides.

Such high melting point metal, or nitride or carbide of the high melting point metal has effect of promoting enlargement in crystal grain. The high melting point metal is metal with a melting point of 150° C. or higher. It is desirably titanium (Ti), tantalum (Ta), zirconium (Zr), hafnium (Hf), vanadium (V), tungsten (W), niobium (Nb) or molybdenum (Mo). Especially titanium (Ti) and tantalum (Ta) have significant effect.

By being thus composed, a small number of enlarged Cu crystal grains are grown at the initial stage of room temperature grain growth, (111) face of Cu is preferentially grown in the process of growth, and the enlarged Cu crystal grains are grown having an average grain diameter seven to eight times the wiring width W. With the average grain diameter satisfying D>10×L, the resistivity of wiring layer can be lowered to that of bulk. Thus, a nano-scale Cu wiring with low resistivity and high reliability can be realized.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

A wiring structure in the preferred embodiment of the invention will be described below. The evaluation items are resistivity measurement by four-point probe, surface/cross section observation (SIM)images by focused ion beam (FIB), and crystal structure analysis by X-ray diffraction (XRD). Si substrate is used as the semiconductor, $Si_3N_4$ is formed on the Si substrate in order to observe the crystal grain of Cu film, and TiN is used as crystal grain promotion layer.

The Si substrate is cleaned by acetone and IPA, and then it is laid in a chamber of sputtering apparatus. Then, the chamber is highly vacuumed to $4 \times 10^{-9}$ Torr, Ar of 8.5 CCM and $N_2$ of 0.5 CCM are introduced therein, and $Si_3N_4$ of 60 nm thick is formed thereon using Si as target at a pressure of $5 \times 10^{-3}$ Torr. Then, the chamber is highly vacuumed to $4 \times 10^{-9}$ Torr, Ar of 8.5 CCM and $N_2$ of 0.5 CCM are introduced therein, and TiN, crystal promotion layer, of 0.1 μm thick is formed thereon using Ti as target at a pressure of $5 \times 10^{-3}$ Torr. Then, the chamber is highly vacuumed to $4 \times 10^{-9}$ Torr, Ar of 10.0 CCM is introduced therein, and Cu, wiring layer, of 1.0 μm thick is formed thereon using Cu as target at a pressure of $6 \times 10^{-3}$ Torr. A comparative example without TiN layer is prepared. The property evaluation is conducted such that the behavior of grain growth at room temperature and after heat treatment of 2.5 hours at room at 350° C. in argon (Ar) atmosphere is evaluated with respect to the above evaluation items.

The result of XRD measurement, though the spectrum is not shown herein, proves that, in the invention with TiN layer, comparing to the comparative example, the intensity of (111) of Cu increases and (111) face is grown preferentially.

Figure 1A:
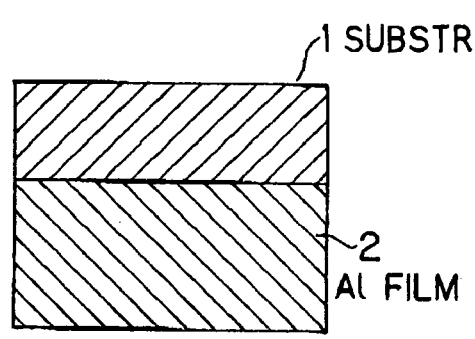
FIGS. 1A and 1B are cross sectional views showing the conventional method of making a wiring structure.
Figure 1A:
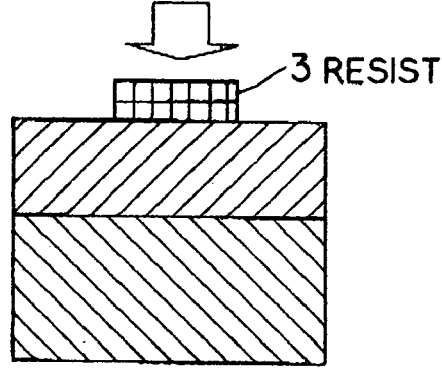
Figure 1A:
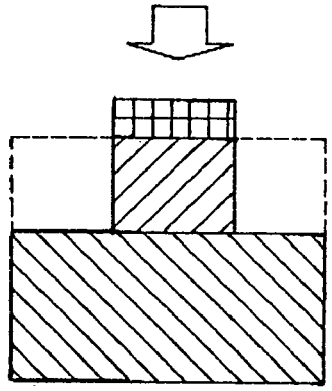
Figure 1A:
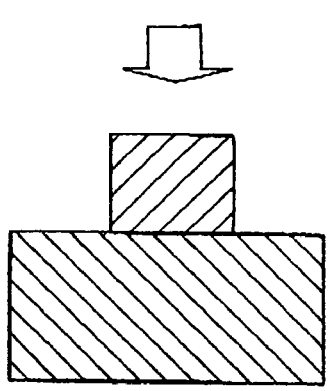
Figure 1B:
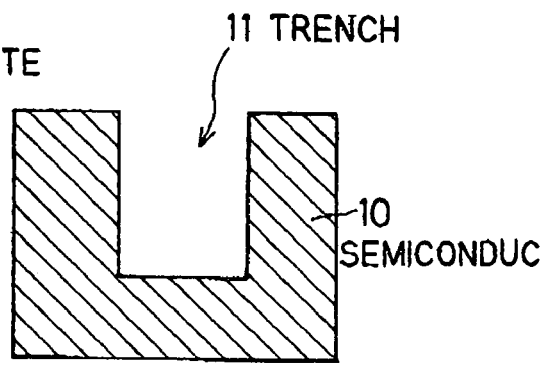
Figure 1B:
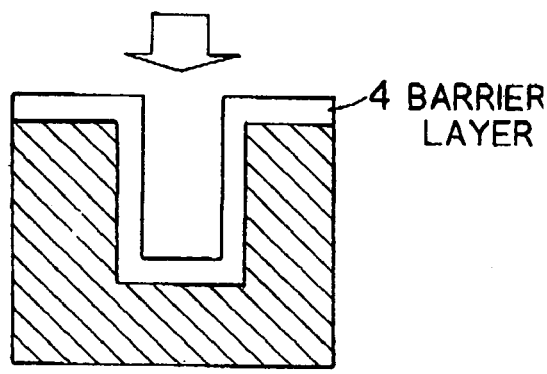
Figure 1B:
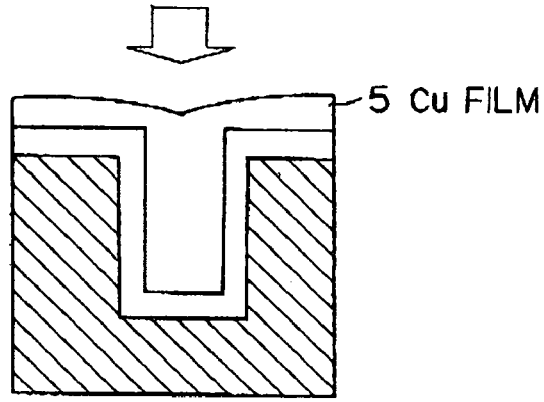
Figure 1B:
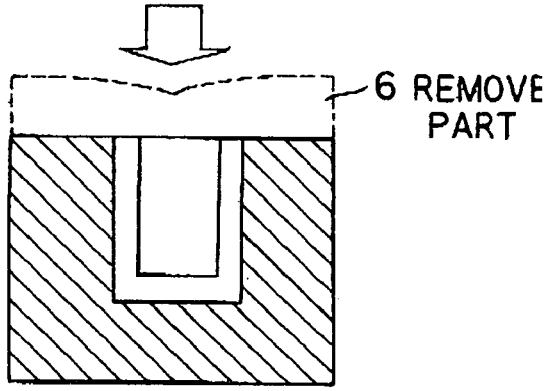
Figure 2A:
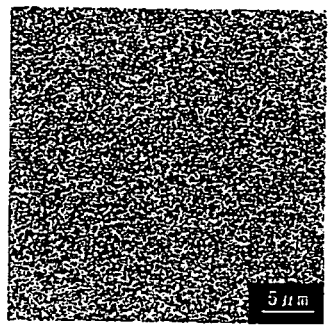
FIG.2A is surface observation (SIM) images by focused ion beam (FIB) showing the behavior of room temperature grain growth in a wiring structure of the invention.
Figure 2A:
Figure 2A:
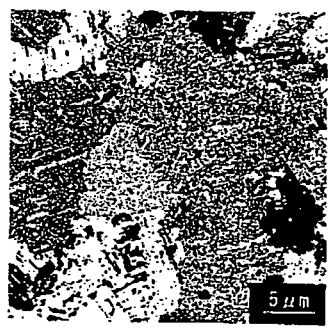
Figure 2B:
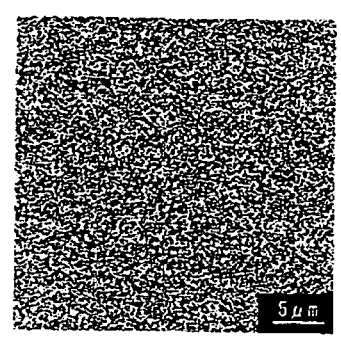
FIG. 2B is surface observation (SIM) images by FIB showing the behavior of room temperature grain growth in a wiring structure of comparative example.
Figure 2B:
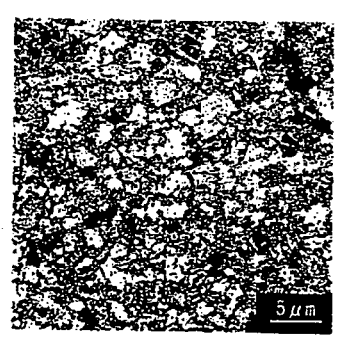
Figure 2B:
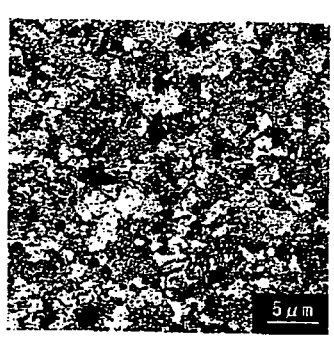
Figure 3A:
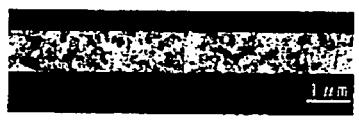
FIG. 3A is cross section observation (SIM) images by FIB showing the behavior of room temperature grain growth in the wiring structure of the invention.
Figure 3A:
Figure 3A:
Figure 3B:
FIG. 3B is cross section observation (SIM) images by FIB showing the behavior of room temperature grain growth in the wiring structure of comparative example.
Figure 3B:
Figure 3B:
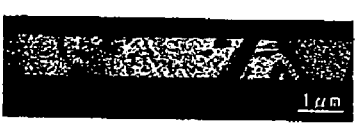

FIGS. 2A and 2B are the surface observation (SIM) images by FIB to show the behavior of room temperature grain growth, and FIGS. 3A and 3B are the cross section observation images. FIGS. 2A and 3A are those of the invention and FIGS. 3A and 3B are those of the comparative example. Viewing from the results, it is proved that in the invention large grains are less at the initial stage of room temperature grain growth and the grains are preferentially grown in the process of growth. The large grain of the invention has an average diameter seven to eight times that of the comparative example at the saturation stage, and this average diameter is 10 times or more the mean free path (39 nm) of electron. Therefore, it is confirmed that TiN has a crystal grain promotion function. Furthermore, the time required to reach the saturation stage of the invention is reduced to about one third of that of the comparative example. Therefore, it is also confirmed that the crystal grain promotion function is significant.

Figure 4A:
FIG. 4A is a surface observation image by FIB after heat treatment in the wiring structure of the invention.
Figure 4B:
FIG. 4B is a surface observation image by FIB after heat treatment in the wiring structure of comparative example.

FIGS. 4A and 4B are surface and cross section observation images by FIB after heat treatment. FIG. 4A is that of the invention and FIG. 4B is that of the comparative example. Both in the invention and the comparative example, the average diameter of large grain does not appear to be significantly grown after heat treatment. However, according as the microscopic grain region decreases, the average grain diameter increases and the diameters are equalized. As a result, it is found that the average grain diameter of the invention becomes about twelve times that of the comparative example. Also, it is found that the average grain diameter at room temperature grain growth highly influences the grain diameter distribution after heat treatment.

Figure 5:
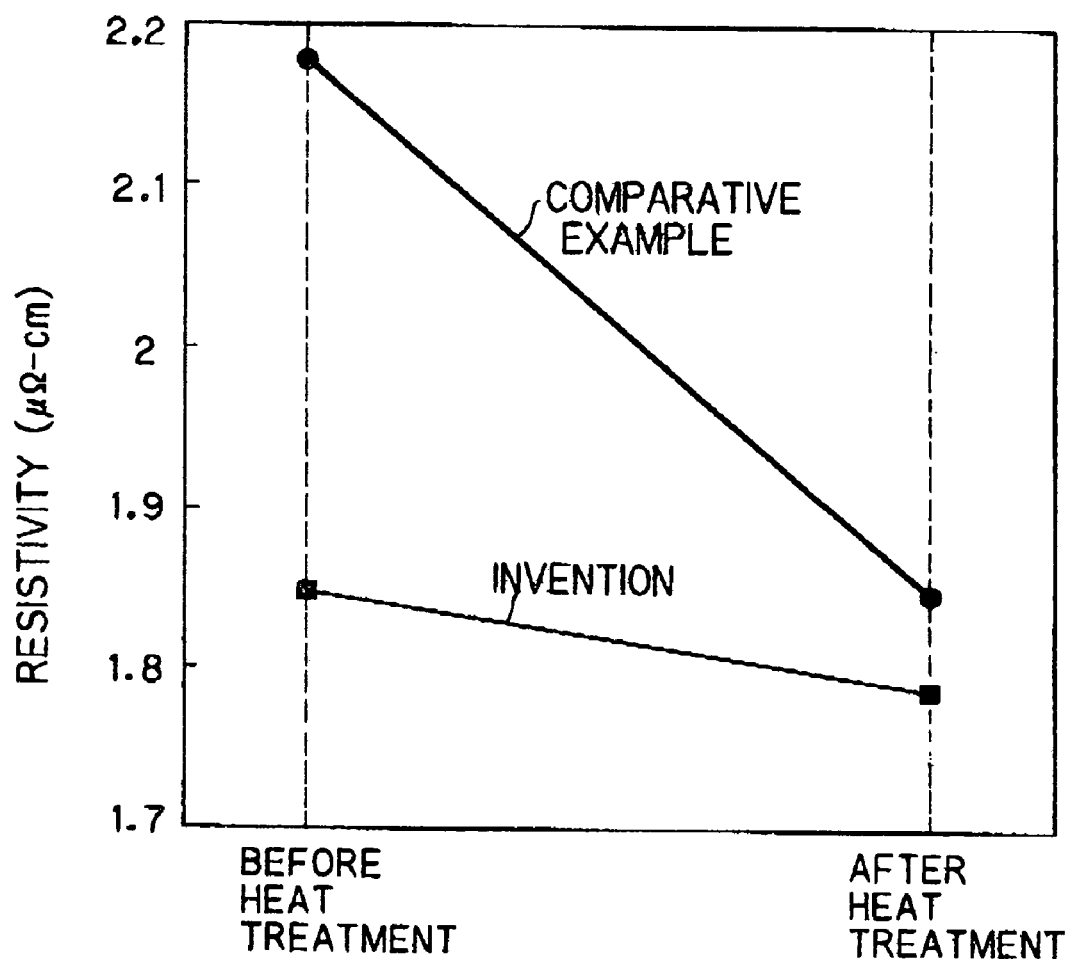
FIG. 5 shows resistivity changes before and after heat treatment in the wiring structures of the invention and the comparative example.

FIG. 5 shows resistivity changes before and after heat treament. As shown, the resistivity of the invention is lower than that of the comparative example both before heat treatment and after heat treament.

Although in the above embodiment of the invention the Si substrate is used as semiconductor, the same results are obtained in case of the Si substrate with $SiO_2$ formed thereon. It is obvious that the same effects will be obtained in case of having Si semiconductor layer (including impurity-doped layer and multiple layers) formed on the Si substrate and in case of further having $SiO_2$ film on that semiconductor layer. With regard to D (=average grain diameter of crystal grain)>10×L (mean free path of electron), the average grain diameter of Cu may have no upper limit and it is desirable that the diameter becomes infinitely large to give a single crystal. Thereby, the scattering of electron due to crystal grain field can be reduced. It is desirable that the heat treatment is conducted in the range of 100 to 400° C. because, in this range, the invention can have the significant effect. Although in the above embodiment TiN, crystal grain promotion layer, of 0.1 μm is formed, the crystal grain promotion layer does not have to be a uniform layer. Namely, even when it is 1 to 5 nm thick and grain-shaped or island-shaped without being combined, the crystal grain promotion function can be obtained. It is found that the same function or effect as TiN can be obtained in Ti, TiC, Ta, TaN and TaC. It is desirable that the dielectric film is of $SiO_2$ or organic material. The organic material may be formed porous.

The metal film of Ti, Ta or Cu may be made by using vapor deposition, laser annealing that heating is instantly conducted to melting point of metal film to be formed, plating or chemical vapor deposition, other than sputtering.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A wiring structure for semiconductor device, comprising:
    a wiring layer that includes copper as main component; and
    a crystal grain promotion layer that contacts said wiring layer and promotes enlargement in a crystal grain of the wiring layer.

2. The wiring structure for semiconductor device according to claim 1, wherein the crystal grain of the wiring layer satisfies a relation of $D>10\times L$ where D is an average grain diameter of crystal grain to be enlarged finally in the wiring layer and L is mean free path of electrons.

3. The wiring structure for semiconductor device according to claim 1, wherein the crystal grain promotion layer is disposed between the wiring layer and one of a semiconductor and a dielectric film.

4. The wiring structure for semiconductor device according to claim 3, wherein the crystal grain promotion layer has a good contact with the one of a semiconductor and dielectric film and the wiring layer and is of a material that has a low reactivity to the semiconductor or dielectric film and the wiring layer.

5. The wiring structure for semiconductor device according to claim 1, wherein the crystal grain promotion layer comprises one of a high melting point metal, a nitride of the high melting point metal, and a carbide of the high melting point metal.

6. A wiring structure for semiconductor device, comprising:
    a wiring layer that includes copper as main component; and
    a crystal grain promotion layer that contacts said wiring layer and promotes enlargement in a crystal grain of the wiring layer,
    wherein the crystal grain promotion layer comprises a material selected from the group of titanium, tantalum, titanium nitrides, titanium carbides, tantalum nitrides and tantalum carbides.

7. The wiring structure for semiconductor device according to claim 1, wherein said crystal grain promotion layer comprises a metal with a melting point of at least 150° C.

8. The wiring structure for semiconductor device according to claim 1, wherein said crystal grain promotion layer comprises one of titanium, tantalum, zirconium, hafnium, vanadium, tungsten, niobium, molybdenum, a nitride of any of these and a carbide of any of these.

9. The wiring structure for semiconductor device according to claim 1, wherein an average grain diameter (D) of said crystal grain of said wiring layer is in a range from 7 to 8 times a width (W) of said wiring layer.

10. The wiring structure for semiconductor device according to claim 1, wherein said copper in said wiring layer comprises a (111) copper face.

11. The wiring structure for semiconductor device according to claim 1, wherein said copper comprises approximately a single crystal.

12. The wiring structure for semiconductor device according to claim 1, wherein said wiring layer is formed directly on said crystal grain promotion layer.

13. The wiring structure for semiconductor device according to claim 1, wherein said crystal grain promotion layer is formed on one of silicon, silicon nitride, silicon oxide, impurity-doped silicon, and an organic dielectric material.

14. The wiring structure for semiconductor device according to claim 1, wherein an average grain diameter of said crystal grain is at least 390 nm.

* * * * *